(12) United States Patent
Lee et al.

(10) Patent No.: US 7,626,209 B2
(45) Date of Patent: Dec. 1, 2009

(54) LIGHT EMITTING DIODE HAVING ACTIVE REGION OF MULTI QUANTUM WELL STRUCTURE

(75) Inventors: Dong Seon Lee, Ansan-si (KR); Eu Jin Hwang, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 12/261,627

(22) Filed: Oct. 30, 2008

(65) Prior Publication Data
US 2009/0152586 A1 Jun. 18, 2009

(30) Foreign Application Priority Data
Dec. 18, 2007 (KR) ............... 10-2007-0132999
Dec. 18, 2007 (KR) ............... 10-2007-0133000

(51) Int. Cl.
H01L 33/00 (2006.01)
(52) U.S. Cl. ............. 257/94; 257/97; 257/101; 257/102; 257/E33.008; 257/E33.016; 257/E33.025
(58) Field of Classification Search .......... 257/94, 257/97, 101, 102, E33.008, E33.016, E33.025
See application file for complete search history.

(56) References Cited

U.S. PATENT DOCUMENTS

| | | | | |
|---|---|---|---|---|
| 5,990,496 A | * | 11/1999 | Kunisato et al. ............ 257/94 |
| 7,372,066 B2 | * | 5/2008 | Sato et al. ................. 257/14 |
| 2007/0063207 A1 | * | 3/2007 | Tanizawa et al. ........... 257/94 |
| 2007/0246736 A1 | * | 10/2007 | Senda et al. ............... 257/103 |
| 2007/0284588 A1 | * | 12/2007 | Kinoshita .................. 257/79 |
| 2009/0008648 A1 | * | 1/2009 | Biwa et al. ................ 257/76 |
| 2009/0059984 A1 | * | 3/2009 | Ohta et al. ............ 372/45.011 |
| 2009/0146162 A1 | * | 6/2009 | Chakraborty et al. ........ 257/94 |
| 2009/0166607 A1 | * | 7/2009 | Nakahara et al. ........... 257/13 |
| 2009/0206325 A1 | * | 8/2009 | Biwa et al. ................ 257/28 |

\* cited by examiner

Primary Examiner—Ngan Ngo
(74) Attorney, Agent, or Firm—H. C. Park & Associates, PLC

(57) ABSTRACT

Disclosed is a light emitting diode having an active region of a multi quantum well structure. The active region is positioned between GaN-based N-type and P-type compound semiconductor layers. At least one of barrier layers in the active region includes an undoped InGaN layer and a Si-doped GaN layer, and the Si-doped GaN layer is in contact with a well layer positioned at a side of the P-type compound semiconductor layer therefrom. Accordingly, carrier overflow and a quantum confined stark effect can be reduced, thereby improving an electron-hole recombination rate. Further, disclosed is an active region of a multi quantum well structure including relatively thick barrier layers and relatively thin barrier layers.

12 Claims, 7 Drawing Sheets

LIGHT EMITTING DIODE HAVING ACTIVE REGION OF MULTI QUANTUM WELL STRUCTURE

CROSS REFERENCE TO RELATED APPLICATIONS

This application claims priority to and the benefit of Korean Patent Application No. 10-2007-0132999, filed on Dec. 18, 2007, and Korean Patent Application No. 10-2007-0133000, filed on Dec. 18, 2007, which are both incorporated by reference for all purposes as if fully set forth herein.

BACKGROUND OF THE INVENTION

1. Field of the Invention

The present invention relates to a light emitting diode, and more particularly, to a light emitting diode having an active region of a multi quantum well structure.

2. Description of the Related Art

In general, since Group III element nitrides, such as GaN, AlN and InGaN, have excellent thermal stability and a direct transition type energy band structure, they have recently come into the spotlight as materials for light emitting diodes (LEDs) in blue and ultraviolet regions. Particularly, an InGaN compound semiconductor has been considerably noticed due to its narrow band gap. LEDs using such a GaN-based compound semiconductor are used in various applications such as large sized full color flat panel displays, backlight sources, traffic lights, indoor illumination, high density light sources, high resolution output systems and optical communications.

Figure 1:
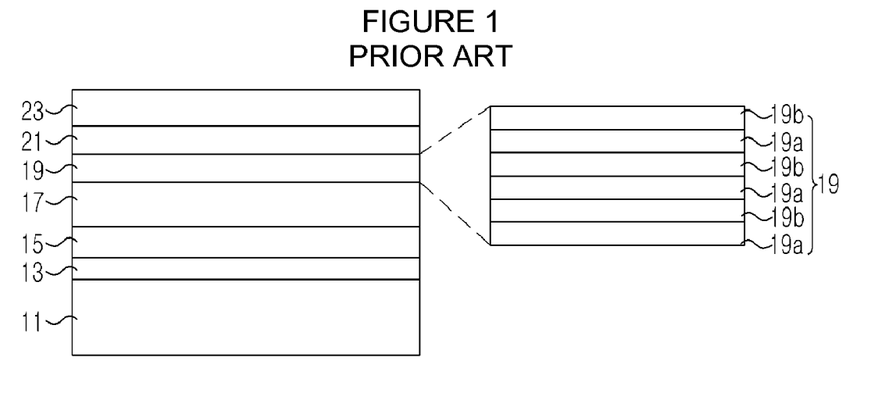
FIG. 1 is a sectional view illustrating a conventional LED having an active region of a multi quantum well structure.
Figure 2:
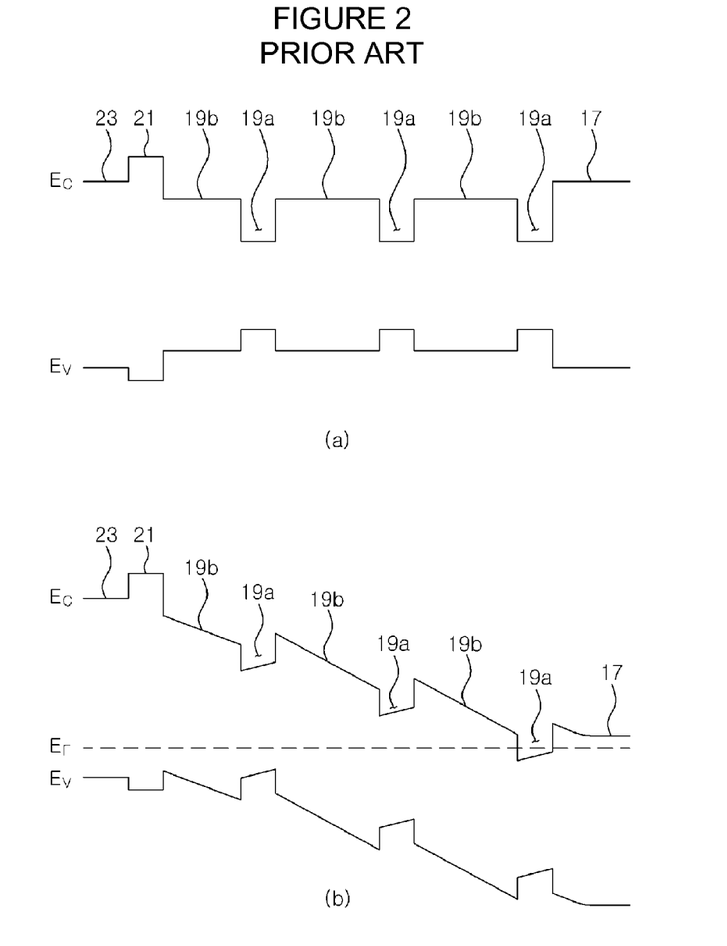
FIG. 2 is a schematic band diagram illustrating the conventional LED having the active region of the multi quantum well structure.
Figure 3:
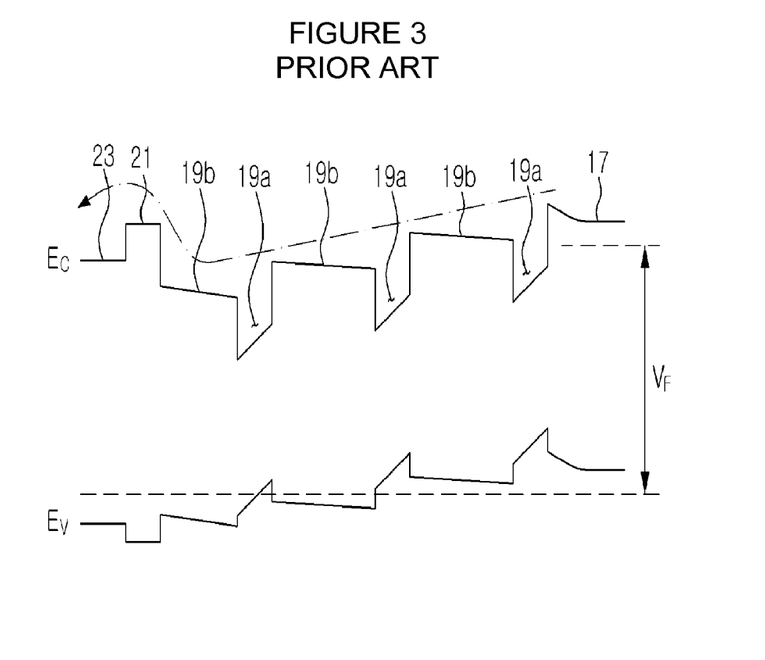
FIG. 3 is a schematic band diagram when a forward voltage is applied to the conventional LED having the active region of the multi quantum well structure.

FIGS. 1 and 2 are a sectional view and a schematic band diagram illustrating a conventional LED having an active region of a multi quantum well structure. FIG. 2(a) simply shows a band diagram of respective layers, and FIG. 2(b) shows a band diagram in an equilibrium state. FIG. 3 is a schematic band diagram when a forward voltage is applied to the LED of FIG. 2.

Referring to FIGS. 1 and 2, an LED comprises an N-type semiconductor layer 17, a P-type semiconductor layer 23 and an active region 19 interposed between the N-type and P-type semiconductor layers 17 and 23. In order to increase recombination efficiency of electrons and holes, a blocking layer 21 having a relatively wide bandgap may be interposed between the P-type semiconductor layer 23 and the active region 19.

The N-type and P-type semiconductor layers comprise Group III element nitride semiconductor layers, e.g., GaN semiconductor layers. The active region 19 is generally formed to have a multi quantum well structure in which well layers 19a and barrier layers 19b are alternately laminated. In an InGaN LED, an active region of a multi quantum well structure is generally formed by alternately laminating InGaN well layers 19a and GaN barrier layers 19b. The well layer 19a comprises a semiconductor layer with a smaller band gap than the N-type and P-type semiconductor layers 17 and 19 and the barrier layer 19b, thereby providing quantum wells in which electrons and holes are recombined.

Here, since polarization is generated by a piezoelectric field in an active region formed of GaN-based semiconductor layers, bands of the well layers 19a are inclined in a direction different from those of the barrier layers 19b, considering polarization in FIG. 2(b). The polarization generated by the piezoelectric field is generally known as the quantum confined stark effect (QCSE). The recombination rate of electrons and holes is decreased due to the QCSE, thereby decreasing luminous efficiency.

Referring to FIG. 3, when a forward voltage $V_F$ is applied to the LED, bands of the N-type semiconductor layer 17 are moved up. When a forward voltage which is similar to or higher than the bandgap potential of the P-type semiconductor layer 23 is applied to the LED, the conduction band Ec of the N-type semiconductor layer 17 is positioned higher than that of the P-type semiconductor layer 23. At this time, the closer to the N-type semiconductor layer 17 the barrier layer 19b is positioned in the active region, the higher the conduction band of the barrier layer is positioned, as shown in this figure. The arrangement of the bands of barrier layers 19b provides driving force for allowing carriers injected from the N-type semiconductor layer 17 not to be subjected to recombination in the active region 19 but to flow into the P-type semiconductor layer, which accordingly causes carrier overflow to occur as shown by a dotted line arrow. The excessive occurrence of such carrier overflow causes the recombination rate of electrons and holes to be deteriorated, thereby decreasing luminous efficiency.

Meanwhile, the blocking layer 21 is employed in order to decrease carrier overflow. The blocking layer 21 is formed of a semiconductor having a wider bandgap to prevent carrier overflow. However, the blocking layer 21 formed of the semiconductor having a wider bandgap has increased lattice mismatch with the P-type semiconductor layer 23, and thus, the crystalline quality of the P-type semiconductor layer 23 grown on the blocking layer 21 is deteriorated. Therefore, there is a certain limit to preventing carrier overflow using the blocking layer 21.

As applications of LEDs are extended to various fields including general illumination, the driving voltage applied to an LED is not limited to a conventional forward voltage of 3V or so but is continuously increased. The increase of the driving voltage causes carrier overflow to be more increased, and accordingly, thereby more decreasing the luminous efficiency of the LED. Therefore, in an LED operated under high voltage (or high current), it is required to develop a new technique for preventing carrier overflow besides the blocking layer 21 and to develop a technique for lowering the driving voltage of the LED.

Meanwhile, the conventional LED comprises an active region of a multi quantum well structure having the barrier layers 19b with the generally same thickness. The thickness of the barrier layers 19b is selected to promote stability of a process and to have optimum luminous characteristics under certain current conditions.

However, the LED may be operated under various current conditions in some cases. For example, in case of an AC LED driven under AC power source, the LED may be driven by AC current that varies continuously. In this case, it is difficult for the conventional LED having the barrier layers 19b with the same thickness to exhibit optimum luminous characteristics under both low and high current conditions.

SUMMARY OF THE INVENTION

Accordingly, an object of the present invention is to provide an LED, wherein QCSE and/or carrier overflow is reduced, thereby improving an electron-hole recombination rate.

Another object of the present invention is to provide an LED capable of reducing driving voltage of the LED.

A further object of the present invention is to provide an LED capable of exhibiting effective luminous characteristics under environment that operational conditions are changed, such as AC current.

According to the present invention for achieving the objects, there is provided an LED having an active region of a multi quantum well structure. An LED according to embodiments of the present invention includes a GaN-based N-type compound semiconductor layer; a GaN-based P-type compound semiconductor layer; and an active region of a multi quantum well structure having InGaN well layers and barrier layers alternately laminated, wherein the active region is interposed between the N-type and P-type compound semiconductor layers. At least one of the barrier layers in the active region includes an undoped InGaN layer and a Si-doped GaN layer, and the Si-doped GaN layer is positioned closer to a side of the P-type compound semiconductor layer than the undoped InGaN layer.

Each of the barrier layers positioned between the well layers among the barrier layers may include the undoped InGaN layer and the Si-doped GaN layer.

According to embodiments of the present invention, an InGaN layer having a relatively narrow bandgap is employed as a barrier layer, thereby reducing carrier overflow. Further, a Si-doped GaN layer is employed as a barrier layer, so that a quantum confined stark effect (QCSE) of a well layer being in contact with the Si-doped GaN layer can be reduced, thereby improving a recombination rate of electrons and holes. Furthermore, the Si-doped GaN layer is employed, so that the specific resistivity of the barrier layer is decreased, and therefore, the driving voltage of the LED can be lowered.

The Si-doped GaN layer may be relatively thinner than the undoped InGaN layer. If the Si-doped GaN layer is thicker than the undoped InGaN layer, it is difficult to prevent carrier overflow.

Meanwhile, a plurality of barrier layers among the barrier layers may include undoped InGaN layers, respectively, and the undoped-InGaN layers may have a narrower bandgap as they are positioned closer to the N-type compound semiconductor layer. Accordingly, the driving force for allowing carriers to move can be removed or reduced depending on the arrangement of the bands of the barrier layers, so that the carrier overflow can be more reduced.

In addition, among the plurality of barrier layers, each of barrier layers positioned between the well layers may include Si-doped GaN layers, respectively.

Meanwhile, the barrier layers positioned between the well layers may include a plurality of relatively thick barrier layers having a thickness 1.3 to 3 times as large as that of the thinnest barrier layer between the well layers and a plurality of relatively thin barrier layers having a thickness 1 to 1.3 times as large as that of the thinnest barrier layer between the well layers. Barrier layers having different thicknesses are employed, so that effective luminous characteristics can be achieved under environment where operational conditions are changed.

In addition, the relatively thick barrier layers and the relatively thin barrier layers may be alternately laminated.

Meanwhile, a blocking layer may be interposed between the P-type compound semiconductor layer and the active region. The blocking layer restricts movement of electrons and thus helps electrons and holes to be recombined in the active region. The blocking layer may be formed of AlGaN.

An LED according to other embodiments of the present invention for achieving the objects includes a GaN-based N-type compound semiconductor layer; a GaN-based P-type compound semiconductor layer; and an active region of a multi quantum well structure having well layers and barrier layers alternately laminated, wherein the active region is interposed between the N-type and P-type compound semiconductor layers. The barrier layers are relatively thicker than the well layers, and barrier layers positioned between the well layers include the thinnest barrier layer and the thickest barrier layer.

Here, the thicknesses of the barrier layers may be purposely controlled. For example, the thickest barrier layer may be 1.3 to 3 times as thick as the thinnest barrier layer. When the thickest barrier layer is less than 1.3 times as thick as the thinnest barrier layer, it is difficult to improve luminous characteristics by thickness control. When the thickest barrier layer is more than 3 times as thick as the thinnest barrier layer, the barrier layer is excessively thick, and therefore, it is difficult to lower the driving voltage of the LED.

Meanwhile, barrier layers positioned between the well layers may include a plurality of relatively thin barrier layers and a plurality of relatively thick barrier layers. Here, the relatively thick barrier layers may have a thickness 1.3 to 3 times as large as that of the thinnest barrier layer positioned between the well layers, and the relatively thin barrier layers may have a thickness 1 to 1.3 times as large as that of the thinnest barrier layer positioned between the well layers.

Accordingly, effective light emission of the LED can be achieved by means of relatively thin barrier layers under low current and by means of relatively thick barrier layers under high current.

The relatively thin barrier layers and the relatively thick barrier layers may be arranged in various manners. For example, the plurality of relatively thin barrier layers may be arranged close to each other, and the plurality of relatively thick barrier layers may be arranged close to each other. Alternatively, the plurality of relatively thin barrier layers and the plurality of relatively thick barrier layers may be alternately arranged.

In some embodiments of the present invention, the plurality of relatively thick barrier layers may be Si-doped barrier layers. Accordingly, the specific resistivity of the relatively thick barrier layers can be lowered, thereby decreasing the driving voltage of the LED.

Generally, when barrier layers are doped with Si, the driving voltage of the LED can be lowered, but luminance may be decreased depending on the Si doping. Although the plurality of relatively thin barrier layers may be barrier layers doped with Si, the present invention is not limited thereto. That is, the plurality of relatively thin barrier layers may be barrier layers which are not doped with Si or barrier layers doped with Si at a lower concentration than the plurality of relatively thick barrier layers.

In further embodiments of the present invention, each of the relatively thick barrier layers may be a barrier layer doped with Si partially at a portion thereof closer to the P-type compound semiconductor layer. In addition, at least one of the barrier layers positioned between the well layers may include an undoped InGaN layer and a Si-doped GaN layer. The Si-doped GaN layer may be positioned closer to the P-type compound semiconductor layer than the undoped InGaN layer.

DETAILED DESCRIPTION OF THE INVENTION

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 4:
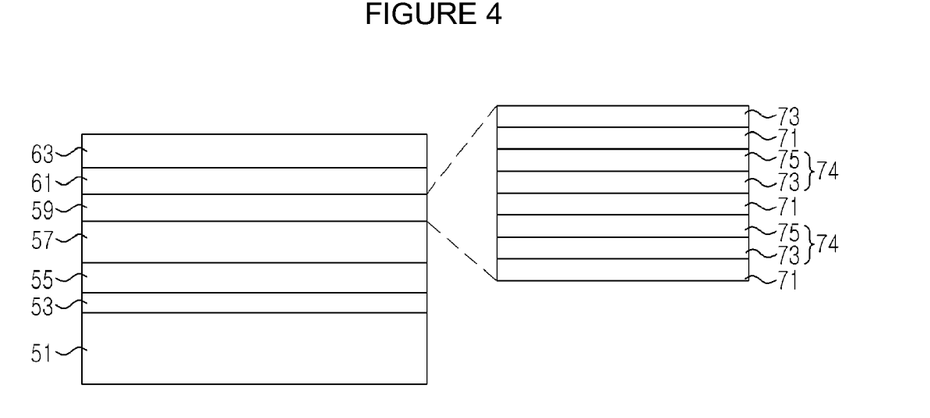
FIG. 4 is a sectional view illustrating an LED having an active region of a multi quantum well structure according to a first embodiment of the present invention.
Figure 5:
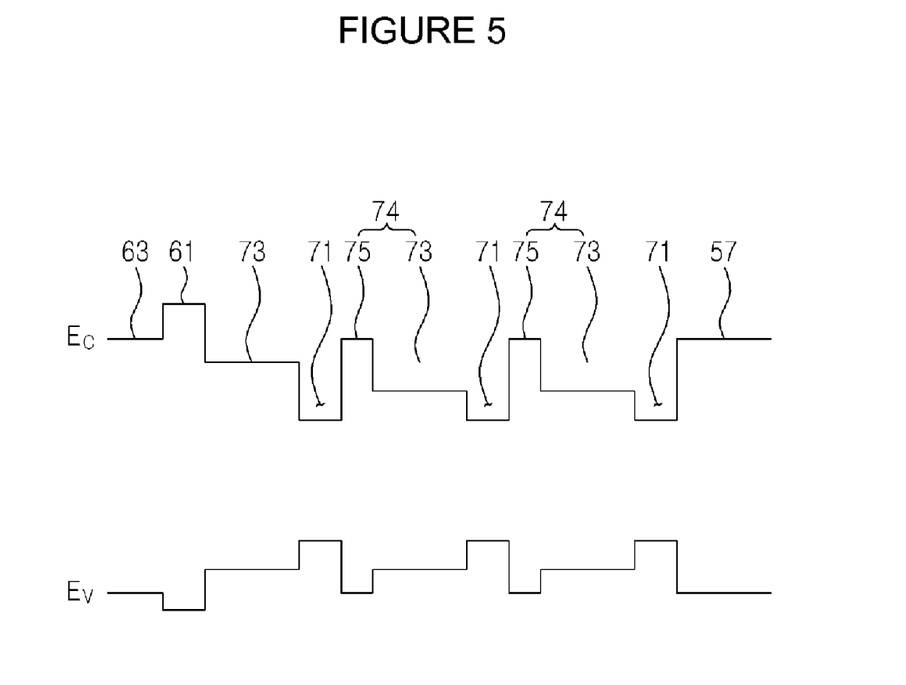
FIG. 5 is a schematic band diagram illustrating the LED having the active region of the multi quantum well structure according to the first embodiment of the present invention.
Figure 6:
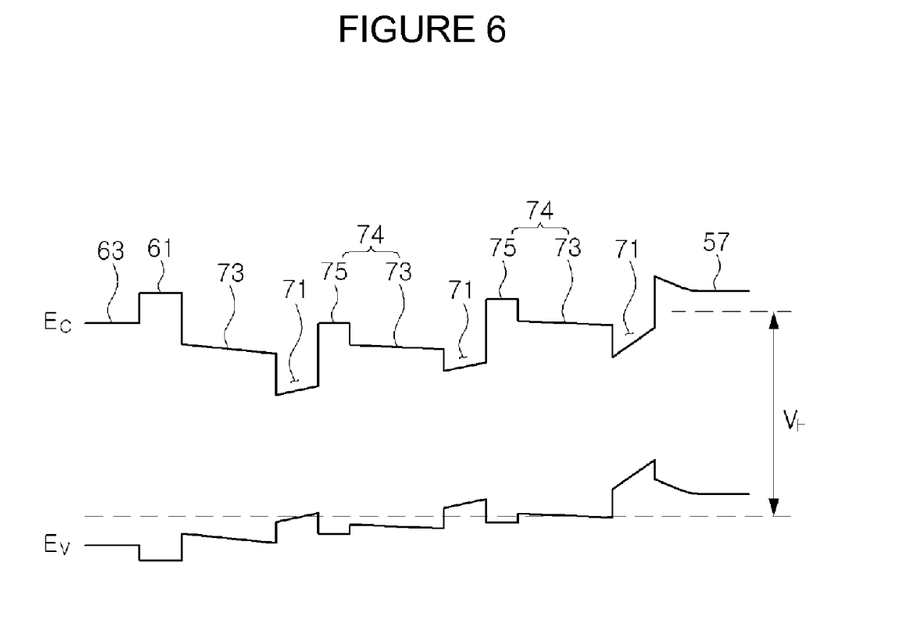
FIG. 6 is a schematic band diagram when a forward voltage is applied to the LED having the active region of the multi quantum well structure according to the first embodiment of the present invention.

FIG. 4 is a sectional view illustrating an LED having an active region of a multi quantum well structure according to a first embodiment of the present invention, and FIG. 5 is a schematic band diagram illustrating the LED having the active region of the multi quantum well structure according to the first embodiment of the present invention. FIG. 6 is a schematic band diagram when a forward voltage is applied to the LED having the active region of the multi quantum well structure according to the first embodiment of the present invention.

Referring to FIG. 4, an N-type compound semiconductor layer 57 is positioned on a substrate 51. In addition, a buffer layer may be interposed between the substrate 51 and the N-type compound semiconductor layer 57 and include a low temperature buffer layer 53 and a high temperature buffer layer 55. The substrate 51 is not particularly limited, but may be, for example, a sapphire substrate, a spinel substrate, a SiC substrate, or the like. Meanwhile, the low temperature buffer layer 53 may be generally formed of $Al_xGa_{1-x}N(0 \leq x \leq 1)$, and the high temperature buffer layer 55 may be formed of, for example, undoped GaN or n-type GaN doped with n-type impurities.

A P-type compound semiconductor layer 63 is positioned over the N-type compound semiconductor layer 57, and an active region 59 is interposed between the N-type and P-type compound semiconductor layers 57 and 63. The N-type compound semiconductor layer and the P-type compound semiconductor layer include (Al, In, Ga)N-based Group-III nitride semiconductor layers. For example, the N-type and P-type compound semiconductor layers 57 and 63 may be N-type GaN and P-type GaN, or N-type AlGaN and P-type AlGaN, respectively. In addition, a blocking layer 61 may be interposed between the P-type compound semiconductor layer 63 and the active region 59. The blocking layer 61 may also be formed of an (Al, In, Ga)N-based Group-III nitride semiconductor, e.g., AlGaN. Another blocking layer (not shown) may be interposed between the N-type compound semiconductor layer 57 and the active region 59.

Meanwhile, the active region 59 has a multi quantum well structure in which well layers 71 and barrier layers 74 are alternately laminated. The well layers 71 are formed of InGaN, and a composition ratio thereof may be selected depending on a desired wavelength of light. At least one of the barrier layers 74 includes an undoped InGaN layer 73 and a Si-doped GaN layer 75. In addition, each of the barrier layers 74 positioned between the well layers 71 may include an undoped InGaN layer 73 and a Si-doped GaN layer 75. As shown in the figure, the Si-doped GaN layer 75 is positioned closer to the P-type compound semiconductor layer 63 than the undoped InGaN layer 73. The undoped InGaN layer 73 may be in contact with the well layer 71 positioned at a side of the N-type compound semiconductor layer 57.

Meanwhile, the Si-doped GaN layer 75 is relatively thinner than the undoped InGaN layer 73. On the contrary, it is difficult to prevent carrier overflow because of the GaN layer 75 having a relatively wide bandgap.

The InGaN layer 73 may be interposed between the blocking layer 61 or P-type compound semiconductor layer 63 and the uppermost well layer 71, and an InGaN layer (not shown) may be interposed between the N-type compound semiconductor layer 57 and the lowermost well layer 71. That is, although it has been shown that the well layer 71 is in contact with the N-type compound semiconductor layer 57, an InGaN layer 73 may be in contact therewith. Further, although it has been shown that the InGaN layer 73 is in contact with the blocking layer 61, a well layer 71 may be in contact therewith.

Referring to FIG. 5, the active region 59 of the multi quantum well structure is positioned between the N-type compound semiconductor layer 57 and the P-type compound semiconductor layer 63 (or blocking layer 61). The active region 59 is formed by alternately laminating the well layers 71 having a relatively narrow bandgap and the barrier layers 74 having a relatively wide bandgap.

At least one of the barrier layers 74 includes an undoped InGaN layer 73 and a Si-doped GaN layer 75. The GaN layer 75 is in contact with the well layer 71 positioned at a side of the P-type compound semiconductor layer 63. Such barrier layers 74 may be formed in plural.

Further, a barrier layer having the undoped InGaN layer 73 may be positioned between the P-type compound semiconductor layer 63 (or blocking layer 61) and the well layer 71.

Referring to FIG. 6, if a forward voltage $V_F$ is applied to the LED, bands of the N-type compound semiconductor layer 57 are moved up. When a forward voltage which is similar to or higher than the bandgap potential of the P-type semiconductor layer 63 is applied to the LED, the conduction band Ec of the N-type compound semiconductor layer 57 is positioned higher than that of the P-type compound semiconductor layer 63.

When a high forward voltage is applied to conventional barrier layers formed of the same material, as the barrier layer 19b is closer to the N-type semiconductor layer 17, the conduction band of the barrier layer 19b is positioned higher as shown in FIG. 3. The band slope of these conduction bands provides driving force for allowing carriers (electrons) injected from the N-type semiconductor layer 17 to move toward the P-type semiconductor layer 23, thereby easily generating carrier overflow.

However, according to embodiments of the present invention, since the each of the barrier layers 74 includes an InGaN layer and a GaN layer, the movement of electrons is restricted by the bandgap difference between the InGaN layer 73 and the GaN layer 75, thereby preventing carrier overflow. Furthermore, the InGaN layer 73 having a relatively narrow bandgap is formed thicker than the GaN layer 75, so that conduction bands in the active region 59 are entirely lowered, thereby effectively preventing carrier overflow.

In addition, the GaN layer 75 being in contact with the well layer 71 positioned at a side of the P-type compound semiconductor layer 63 is doped with Si, so that influence on a piezoelectric field can be decreased by reducing strain of the InGaN layer. As a result, the quantum confined stark effect (QCSE) is decreased, and thus, the recombination rate of electrons and holes is improved. Furthermore, some of the undoped InGaN barrier layers are replaced by Si-doped GaN layers, so that the entire specific resistivity of the barrier layers can be lowered. Accordingly, the driving voltage of the LED according to the present invention can be lowered as compared with the conventional LED in which undoped InGaN barrier layers are employed.

Figure 7:
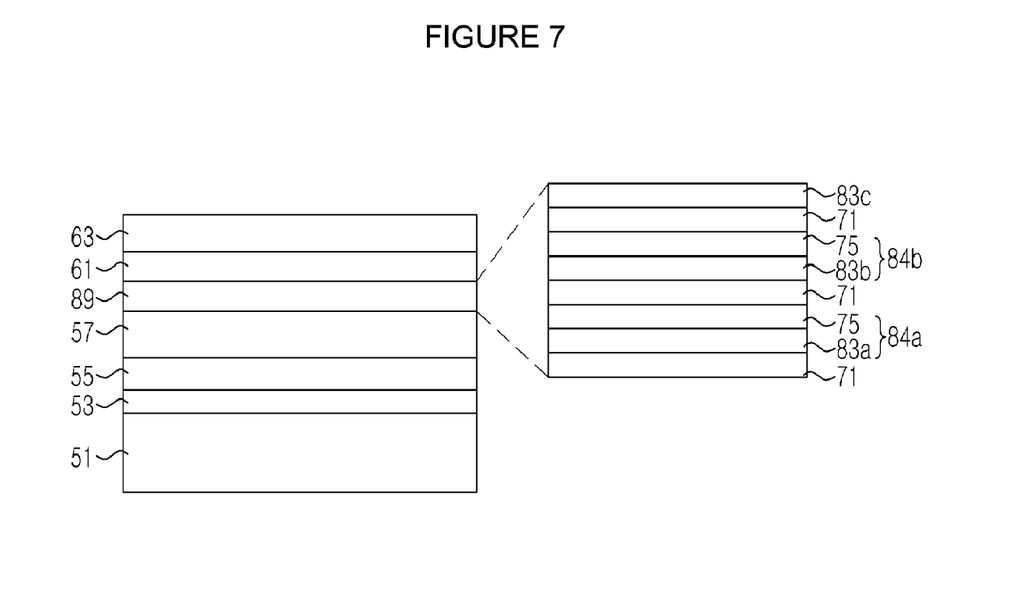
FIG. 7 is a sectional view illustrating an LED having an active region of a multi quantum well structure according to a second embodiment of the present invention.
Figure 8:
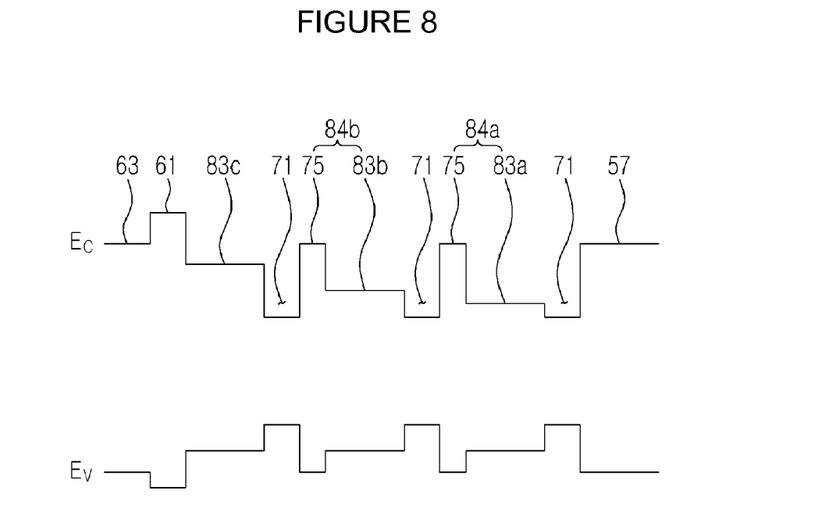
FIG. 8 is a schematic band diagram illustrating the LED having the active region of the multi quantum well structure according to the second embodiment of the present invention.
Figure 9:
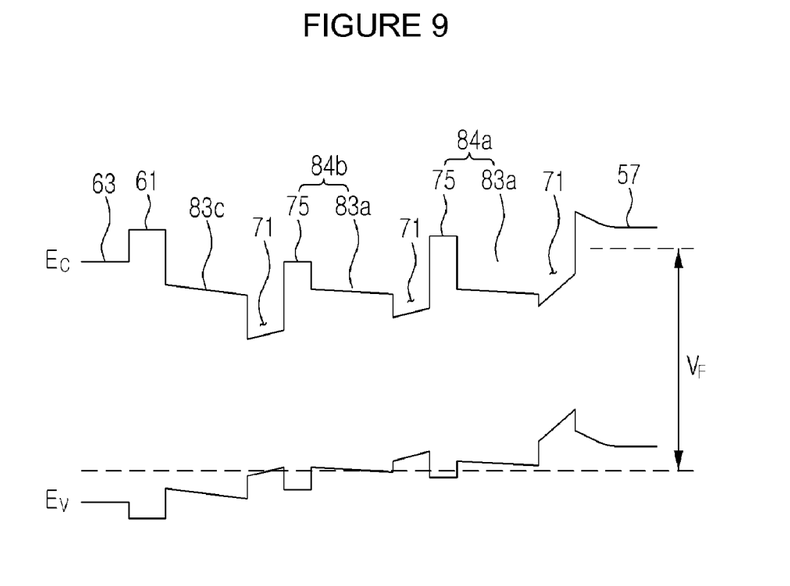
FIG. 9 is a schematic band diagram when a forward voltage is applied to the LED having the active region of the multi quantum well structure according to the second embodiment of the present invention.

FIG. 7 is a sectional view illustrating an LED having an active region of a multi quantum well structure according to another embodiment of the present invention, and FIG. 8 is a schematic band diagram illustrating the LED having the active region of the multi quantum well structure according to the other embodiment of the present invention. FIG. 9 is a schematic band diagram when a forward voltage is applied to the LED having the active region of the multi quantum well structure according to the other embodiment of the present invention. The LED according to this embodiment is identical to the LED described with reference to FIG. 4, except an active region 89. Hereinafter, the following description will be focused on such differences.

Referring to FIG. 7, the active region 89 has a multi quantum well structure in which well layers 71 and barrier layers 84a, 84b and 83c are alternately laminated. The barrier layers 84a, 84b and 83c include undoped InGaN layers 83a, 83b and 83c, respectively. Further, at least one of the barrier layers 84a and 84b includes a Si-doped GaN layer 75. In addition, each of the barrier layers 84a and 84b positioned between the well layers 71 may include a Si-doped GaN layer 75.

As shown in the figure, in each of the barrier layers the Si-doped GaN layer 75 is positioned closer to a P-type compound semiconductor layer 63 than the undoped InGaN layer 83a, 83b or 83c. Each of the undoped InGaN layers 83a, 83b and 83c may be in contact with the well layers 71 positioned at a side of an N-type compound semiconductor layer 57 therefrom. The Si-doped GaN layer 75 is relatively thinner than the undoped InGaN layers 83a and 83b.

Referring to FIG. 8, the active region 89 of the multi quantum well structure is positioned between the N-type compound semiconductor layer 57 and the P-type compound semiconductor layer 63 (or blocking layer 61). The active region 89 is formed by alternately laminating the well layers 71 having a relatively narrow bandgap and the barrier layers 84a, 84b and 83c having a relatively wide bandgap. The barrier layers 84a, 84b and 83c include the undoped InGaN layers 83a, 83b and 83c, respectively, and each of the barrier layers 84a and 84b includes the Si-doped GaN layer 75.

The undoped InGaN layers 83a, 83b and 83c are formed to have a narrower bandgap as they are positioned closer to the N-type compound semiconductor layer 57. That is, bandgaps are increased in the order of the undoped InGaN layers 83a, 83b and 83c. Generally, the bandgap of an InGaN layer increases as the composition ratio of Ga increases, and the bandgap of the InGaN layer decreases as the composition ratio of In increases. Therefore, by varying the composition ratio of Ga and In, the InGaN layers can be formed to have a narrower bandgap as the InGaN layer is closer to the N-type compound semiconductor layer.

Referring to FIG. 9, if a forward voltage $V_F$ is applied to the LED, bands of the N-type compound semiconductor layer 57 are moved up. When a forward voltage which is similar to or higher than the bandgap potential of the P-type semiconductor layer 63 is applied to the LED, the conduction band Ec of the N-type compound semiconductor layer 57 is positioned higher than that of the P-type compound semiconductor layer 63.

When a high forward voltage is applied to conventional barrier layers formed of the same material, as the barrier layer 19b is closer to the N-type semiconductor layer 17, the conduction band of the barrier layer 19b is positioned higher as shown in FIG. 3. The band slope of these conduction bands provides driving force for allowing carriers (electrons) injected from the N-type semiconductor layer 17 to move toward the P-type semiconductor layer 23, thereby easily generating carrier overflow.

However, in the LED according to embodiments of the present invention, since the InGaN layer 83a of the barrier layer 84a close to the N-type compound semiconductor layer 57 has a narrower bandgap than the InGaN layer 83c close to the P-type compound semiconductor layer 63, the band slope of the barrier layers may be decreased even though a high forward voltage is applied to the LED. Particularly, the bandgaps of the InGaN layers 83a, 83b and 83c can be controlled so that the conduction bands of the barrier layers are positioned at the generally same energy level, when a forward voltage is applied to the LED. Accordingly, it is possible to reduce the QCSE by the Si-doped GaN layer 75 and to remove the driving force inducing carrier overflow in the active region 89, thereby more improving the recombination rate of electrons and holes.

Although three barrier layers have been illustrated and described in this embodiment, the present invention is not limited thereto. That is, a larger number of the barrier layers may be alternately laminated with well layers. Further, plural ones of the barrier layers may include undoped InGaN layers, respectively, and the InGaN layers may be formed to have a narrower bandgap as they are positioned closer to the N-type compound semiconductor layer 57.

Meanwhile, although it has been illustrated and described in the aforementioned embodiments that all the barrier layers have the same thickness, the present invention is not limited thereto. That is, the barrier layers may be formed to have different thicknesses. For example, barrier layers having a relatively thick thickness and barrier layers having a relatively thin thickness may be alternately laminated in the active region. The arrangement of the barrier layers may provide the LED, which can have effective luminous characteristics under environment that operational conditions are changed. In such a case, in the barrier layers including Si-doped GaN layers and undoped InGaN layers, the GaN layers may be formed to a predetermined thickness and the InGaN layers may have different thicknesses, and vice versa. In addition, when the Si-doped GaN layers have different thicknesses, the doping concentration of Si may be higher as the thickness of the Si-doped GaN layer is thicker. A case where barrier layers have different thicknesses will be described in detail below.

Figure 10:
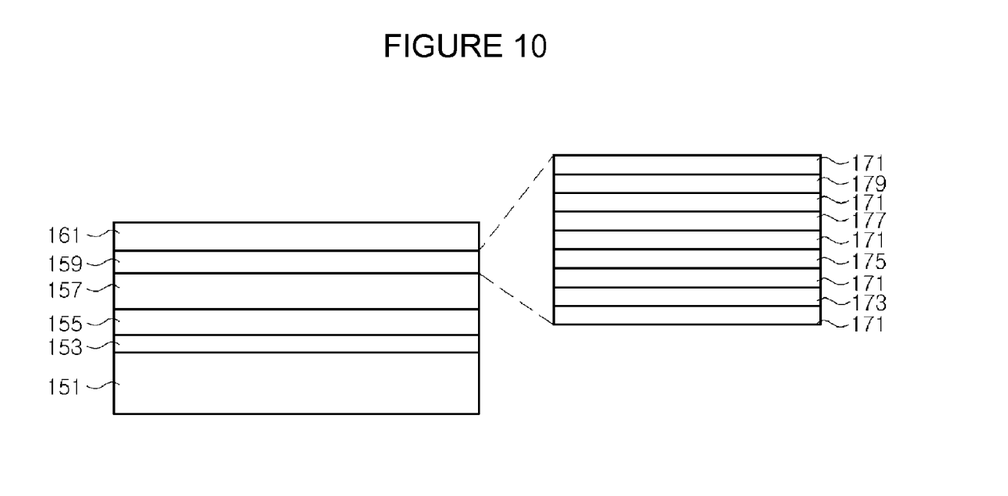
FIG. 10 is a sectional view illustrating an LED having an active region of a multi quantum well structure according to a third embodiment of the present invention.
Figure 11:
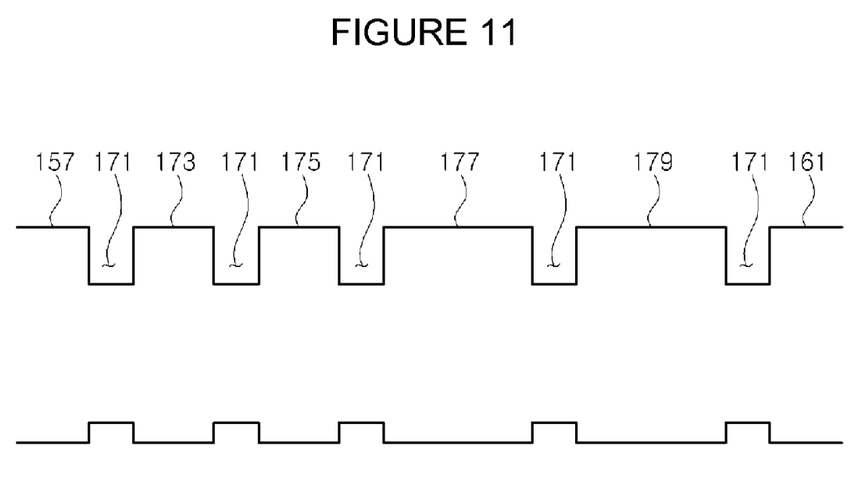
FIG. 11 is a schematic band diagram illustrating the LED having the active region of the multi quantum well structure according to the third embodiment of the present invention.

FIG. 10 is a sectional view illustrating an LED having an active region of a multi quantum well structure according to a further embodiment of the present invention, and FIG. 11 is a schematic band diagram illustrating the LED having the active region of the multi quantum well structure according to the further embodiment of the present invention.

Referring to FIGS. 10 and 11, an N-type compound semiconductor layer 157 is positioned on a substrate 151 as described above. Further, a buffer layer may be interposed between the substrate 151 and the N-type compound semiconductor layer 157. The buffer layer may include a low-temperature buffer layer 153 and a high-temperature buffer layer 155. Moreover, a P-type compound semiconductor layer 161 is positioned over the N-type compound semiconductor layer 157, and an active region 159 is interposed between the N-type and P-type compound semiconductor layers 157 and 161. In addition, a blocking layer (not shown) may be interposed between the P-type compound semiconductor layer 161 and the active region 159, and another blocking layer (not shown) may be interposed between the N-type compound semiconductor layer 157 and the active region 159.

In the meantime, the active region 159 has a multi quantum well structure in which well layers 171 and barrier layers 173, 175, 177 and 179 are alternately laminated. The well layers 171 may be formed of InGaN, and a composition range thereof may be selected depending on a desired wavelength of light.

Meanwhile, each of the barrier layers 173, 175, 177 and 179 may be formed of an (Al, In, Ga)N-based Group-III nitride semiconductor layer, e.g., an InGaN or GaN layer, having a greater bandgap than that of the well layers 171. As described in the previous embodiments, each of the barrier layers may include a Si-doped GaN layer and an undoped InGaN layer.

In addition, the barrier layers 177 and 179 are relatively thicker than the barrier layers 173 and 175. For example, the barrier layers 177 and 179 may have a thickness 1.3 to 3 times as large as that of the barrier layers 173 and 175. When the barrier layers 177 and 179 are less than 1.3 times as thick as the barrier layers 173 and 175, it is difficult to obtain an effect by thickness control. When the barrier layers 177 and 179 are more than 3 times as thick as the barrier layers 173 and 175, the barrier layers 177 and 179 are excessively thick, and therefore, the driving voltage of the LED is excessively increased.

Meanwhile, all the barrier layers 173, 175, 177 and 179 are doped with Si, and the driving voltage of the LED can be lowered by the Si doping. Further, although all the barrier layers may be doped at the same concentration, it is preferred that the barrier layers 173 and 175 be doped at a lower concentration than the barrier layers 177 and 179. On the contrary, the barrier layers 173 and 175 may not be doped with Si. Since the barrier layers 173 and 175 are relatively thin, an increase in the driving voltage of the LED is not large even though the barrier layers are not doped with Si. Further, the Si doping is omitted, thereby preventing luminance reduction generated due to the Si doping.

Although Si may be doped throughout the entire thickness of the barrier layers 173, 175, 177 or 179, the present invention is not limited thereto. That is, the barrier layers may be partially doped with Si. In such a case, in each barrier layer doped with Si, it is preferred that a portion of the barrier layer closer to the P-type compound semiconductor layer be partially doped with Si in order to reduce the piezoelectric field.

Figure 12:
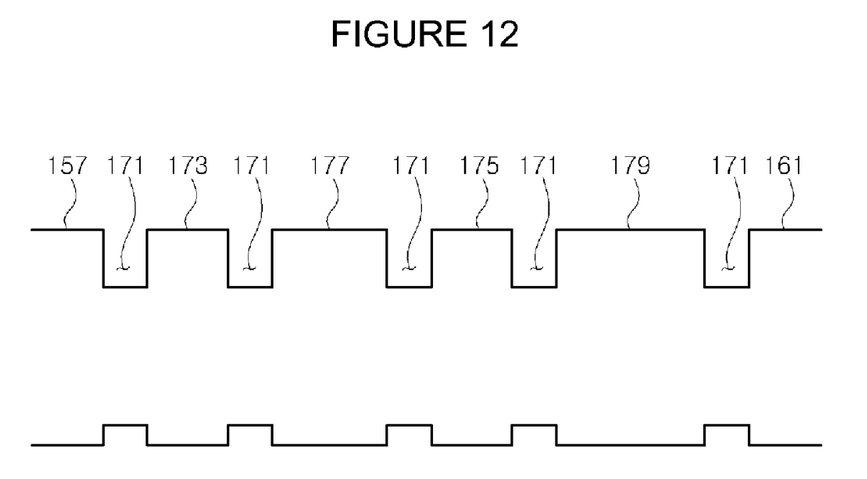
FIG. 12 is a schematic band diagram illustrating an LED having an active region of a multi quantum well structure according to a fourth embodiment of the present invention.

In this embodiment, it has been illustrated and described that the relatively thin barrier layers 173 and 175 are arranged close to each other, and the relatively thick barrier layers 177 and 179 are arranged close to each other. However, as shown in FIG. 12, the relatively thin barrier layers 173 and 175 and the relatively thick barrier layers 177 and 179 may be alternately arranged.

Although the four barrier layers have been illustrated and described in this embodiment, the number of the barrier layers may be greater than four.

Figure 13:
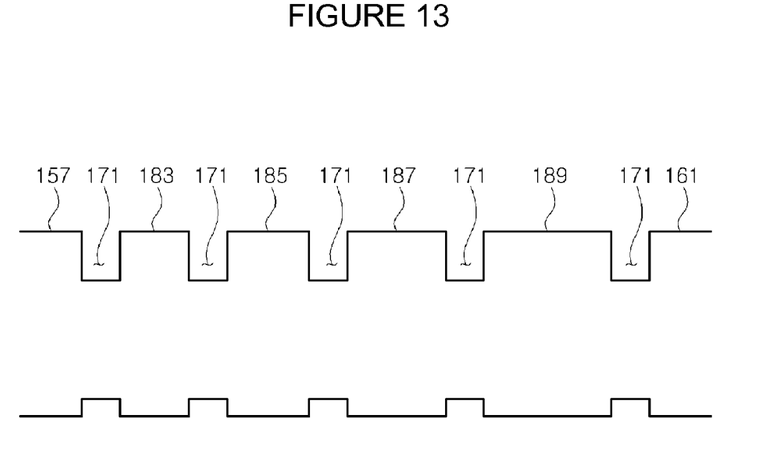
FIG. 13 is a schematic band diagram illustrating an LED having an active region of a multi quantum well structure according to a fifth embodiment of the present invention.

FIG. 13 is a schematic band diagram illustrating an LED having an active region of a multi quantum well structure according to a still further embodiment of the present invention.

Referring to FIG. 13, the LED is roughly identical to that described with reference to FIGS. 10 and 11, except the thicknesses of barrier layers in an active region 159.

That is, in this embodiment, the thicknesses of barrier layers 183, 185, 187 and 189 positioned between well layers 171 are not constant and varied between the thicknesses of the thinnest barrier layer 183 and the thickest barrier layer 189. Here, the thickness of the thickest barrier layer 189 is in a range of 1.3 to 3 times of the thickness of the thinnest barrier layer 183.

In addition, the barrier layers may be arranged in the active region 159 in order of thickness, from the thinnest to the thickest or vice versa.

In this embodiment, there is provided an LED capable of effectively emitting light under variable operational conditions by controlling the thickness of the respective barrier layers in accordance with changes in the operational conditions.

Meanwhile, the barrier layers 183, 185, 187 and 189 may be barrier layers doped with highly concentrated Si as the thickness is increased. Further, relatively thin barrier layers may not be doped with Si or may be doped with low concentrated Si.

In addition, the barrier layers may include a barrier layer doped with Si partially at a portion thereof closer to the P-type compound semiconductor layer. The partial Si doping reduces strain of well layers, thereby making it possible to reduce the polarization generated by a piezoelectric field, and the luminance reduction generated due to the Si doping can be minimized. In this case, each of the barrier layers includes a GaN layer and an undoped InGaN layer, the GaN layer may be positioned close to the P-type compound semiconductor layer, and the GaN layer may be entirely or partially doped with Si.

Although the four barrier layers have been illustrated and described in this embodiment, the present invention is not limited thereto. That is, a larger number of the barrier layers may be alternately laminated with well layers.

According to the embodiments of the present invention, an LED comprises barrier layers having undoped InGaN layers and Si-doped GaN layers, so that carrier overflow and QCSE can be reduced, thereby enhancing luminous efficiency of the LED and decreasing driving voltage of the LED. Further, an LED comprises an active region having relatively thick barrier layers and relatively thin barrier layers, so that effective luminous characteristics can be exhibited under varying operational conditions.

What is claimed is:

1. A light emitting diode (LED), comprising:
a GaN-based N-type compound semiconductor layer;
a GaN-based P-type compound semiconductor layer; and
an active region of a multi quantum well structure having InGaN well layers and barrier layers alternately laminated, the active region being interposed between the N-type and P-type compound semiconductor layers,
wherein at least one of the barrier layers in the active region includes an undoped InGaN layer and a Si-doped GaN layer, and the Si-doped GaN layer is positioned closer to the P-type compound semiconductor layer than the undoped InGaN layer.

2. The LED as claimed in claim 1, wherein the Si-doped GaN layer is thinner than the undoped InGaN layer.

3. The LED as claimed in claim 1, wherein each of barrier layers positioned between the well layers among the barrier layers includes the undoped InGaN layer and the Si-doped GaN layer.

4. The LED as claimed in claim 3, wherein the barrier layers positioned between the well layers includes a plurality of relatively thick barrier layers having a thickness 1.3 to 3 times as large as that of the thinnest barrier layer positioned between the well layers and a plurality of relatively thin barrier layers having a thickness 1 to 1.3 times as large as that of the thinnest barrier layer.

5. The LED as claimed in claim 4, wherein the relatively thick barrier layers and the relatively thin barrier layers are alternately laminated.

6. The LED as claimed in claim 1, wherein a plurality of barrier layers among the barrier layers include the undoped InGaN layers, respectively; and the undoped-InGaN layers have a narrower bandgap as they are positioned closer to the N-type compound semiconductor layer.

7. The LED as claimed in claim 6, wherein each of barrier layers positioned between the well layers among the plurality of barrier layers includes a Si-doped GaN layer.

8. An LED, comprising:
a GaN-based N-type compound semiconductor layer;
a GaN-based P-type compound semiconductor layer; and
an active region of a multi quantum well structure having well layers and barrier layers alternately laminated, the active region being interposed between the N-type and P-type compound semiconductor layers,
wherein the barrier layers are relatively thicker than the well layers; and the barrier layers positioned between the well layers include a plurality of relatively thick barrier layers having a thickness 1.3 to 3 times as large as that of the thinnest barrier layer and a plurality of relatively thin barrier layers having a thickness 1 to 1.3 times as large as that of the thinnest barrier layer.

9. The LED as claimed in claim 8, wherein the plurality of relatively thin barrier layers and the plurality of relatively thick barrier layers are alternately laminated.

10. The LED as claimed in claim 9, wherein each of the plurality of relatively thick barrier layers is a barrier layer doped with Si partially at a portion of the barrier layer closer to the P-type compound semiconductor layer.

11. The LED as claimed in claim 8, wherein the barrier layers positioned between the well layers include barrier layers doped with Si partially at a portion of the barrier layer closer to the P-type compound semiconductor layer.

12. The LED as claimed in claim 8, wherein at least one of the barrier layers positioned between the well layers includes an undoped InGaN layer and a Si-doped GaN; and the Si-doped GaN layer is positioned closer to the P-type compound semiconductor layer than the undoped InGaN layer.

* * * * *